(12) United States Patent
Breng et al.

(10) Patent No.: US 7,964,428 B2
(45) Date of Patent: Jun. 21, 2011

(54) MICROMECHANICAL COMPONENT AND METHOD FOR FABRICATING A MICROMECHANICAL COMPONENT

(75) Inventors: Uwe Breng, Gundelfingen (DE); Wolfram Geiger, Freiburg (DE)

(73) Assignee: LITEF GmbH, Freiburg (DE)

( * ) Notice: Subject to any disclaimer, the term of this patent is extended or adjusted under 35 U.S.C. 154(b) by 635 days.

(21) Appl. No.: 11/887,470

(22) PCT Filed: Apr. 3, 2006

(86) PCT No.: PCT/EP2006/003023
§ 371 (c)(1), (2), (4) Date: Sep. 28, 2007

(87) PCT Pub. No.: WO2006/105924
PCT Pub. Date: Oct. 12, 2006

(65) Prior Publication Data
US 2009/0152705 A1 Jun. 18, 2009

(30) Foreign Application Priority Data
Apr. 5, 2005 (DE) .................. 10 2005 015 584

(51) Int. Cl.
H01L 21/00 (2006.01)
(52) U.S. Cl. ................. 438/51; 438/61; 438/65; 438/98
(58) Field of Classification Search .................. None
See application file for complete search history.

(56) References Cited

U.S. PATENT DOCUMENTS

| | | | |
|---|---|---|---|
| 6,392,158 B1 * | 5/2002 | Caplet et al. .................. 174/255 |
| 6,546,623 B2 * | 4/2003 | Caplet et al. .................. 29/846 |
| 7,476,948 B2 * | 1/2009 | Mori et al. .................... 257/415 |
| 2001/0029060 A1 * | 10/2001 | Fukada et al. .................. 438/50 |
| 2002/0088646 A1 * | 7/2002 | Caplet et al. .................. 174/261 |
| 2004/0077121 A1 * | 4/2004 | Maeda et al. ................... 438/75 |

(Continued)

FOREIGN PATENT DOCUMENTS
DE 10324421 1/2005
(Continued)

OTHER PUBLICATIONS

English translation of U.S. Appl. No. 10/324,421, downloaded from European Patent Office on Apr. 15, 2010: http://v3.espacenet.com/publicationDetails/biblio?DB=EPODOC&adjacent=true&locale=en_EP&FT=D&date=20050105&CC=DE&NR=10324421A1&KC=A1.*

(Continued)

Primary Examiner — David E Graybill
(74) Attorney, Agent, or Firm — Elliott N. Kramsky

(57) ABSTRACT

A method for fabricating a microelectromechanical or microoptoelectromechanical component. The method includes producing first and second layer composites. The first has a first substrate and a first insulation layer, which covers at least one part of the surface of the first substrate, while the second has a second substrate and a second insulation layer, which covers at least one part of the surface of the second substrate. An at least partly conductive structure layer is applied to the first insulation layers and the second composite is applied to the structure layer so that the second insulation layer adjoins the structure layer. The first and second layer composites and the structure layer are configured so that at least one part of the structure layer that comprises the active area of the microelectromechanical or microoptoelectromechanical component is hermetically tightly sealed by the first and second layer composites. Contact holes are formed for making contact with conductive regions of the structure layer within the first and/or second substrate.

18 Claims, 4 Drawing Sheets

U.S. PATENT DOCUMENTS

| | | | |
|---|---|---|---|
| 2004/0099917 A1* | 5/2004 | Greathouse et al. | 257/414 |
| 2004/0183149 A1* | 9/2004 | Schenk | 257/415 |
| 2005/0173711 A1* | 8/2005 | Patel et al. | 257/80 |
| 2006/0001114 A1* | 1/2006 | Chen et al. | 257/415 |
| 2009/0152705 A1* | 6/2009 | Breng et al. | 257/690 |

FOREIGN PATENT DOCUMENTS

| | | |
|---|---|---|
| EP | 1203748 | 5/2002 |
| EP | 1 434 031 A2 | 6/2004 |
| FR | 2687778 | 5/1993 |
| JP | 01-143963 | 6/1989 |
| JP | 03-134570 | 6/1991 |
| JP | 06-203712 | 7/1994 |
| JP | 07-306222 | 11/1995 |
| JP | 08-94666 | 4/1996 |
| JP | 2000-186931 | 7/2000 |
| JP | 2001-141463 | 5/2001 |
| JP | 2003-322662 | 11/2003 |
| KR | 2004-56494 | 7/2004 |
| WO | 9853483 | 11/1998 |
| WO | WO 2005/028359 | 3/2005 |

OTHER PUBLICATIONS

Article: H. Henmi et al., "Vacuum Packaging For Microsensors by Glass-Silicon Anodic Bonding", Sensors and Actuators, vol. A43, No. 1/3 (May 1, 1994), pp. 243-248.

Japanese Patent Office Action in Japanese patent application 2008-504671 mailed Jan. 18, 2011 (English language translation).

* cited by examiner

MICROMECHANICAL COMPONENT AND METHOD FOR FABRICATING A MICROMECHANICAL COMPONENT

BACKGROUND

1. Field of the Invention

The present invention relates to components and their methods of manufacture. More particularly, the invention pertains to micromechanical, microelectromechanical and microoptoelectromechanical components and their method of manufacture.

2. Description of the Prior Art

In order to minimize ambient influences such as moisture or contaminants (e.g. dust) on microelectromechanical components (MEMS) or microoptoelectromechanical components (MOEMS), the active structures of such components are often hermetically tightly encapsulated or sealed. ("Active structure" refers, in particular, to movable structures, optical structures or structures having both movable and optical components (e.g. movable mirrors). The term "active area" refers to the area or volume of the component in which the active structure lies or moves). The hermetically sealed encapsulation can also be employed to set a specific internal pressure in the region of the active structures. This is particularly advantageous for components whose functioning depends on a defined internal pressure, such as acceleration sensors and gyroscopes (rate of rotation sensors).

MEMS or MOEMS components are generally manufactured at the wafer level so that production can be as cost-effective as possible. The joining processes that are often required can be effected by direct bonding and anodic bonding processes.

Leading electrical contacts out of the hermetically sealed region to make contact with specific parts of the component (e.g. with the active structure) is difficult to accomplish. Various possibilities exist: the electrical contacts can be accomplished, for example, by laterally extending semiconductor layers produced by implantation or diffusion with low sheet resistance (see Reference 1 infra). Realization by patterned conductive layers covered with a planarized passivation layer is also possible.

As an alternative, electrical contacts in the form of a plurality of vertically extending plated-through holes can be led out of the component. To produce such holes, contact holes are first produced in the component, with conductive material subsequently introduced into the contact holes. The conductive material introduced into the contact holes may be, for example, metal deposited by vapor deposition, sputtering, electrodeposition or a CVD (chemical vapor deposition) process. The conductive material may also comprise some other material such as doped semiconductor (polysilicon). Before the conductive material is introduced into the contact holes, their inner walls are generally provided with an insulating material (e.g. $SiO_2$, $Si_3N_4$, polyimide or the like) to prevent electrical short circuits with other conductive regions of the component.

The contact holes can be produced in various ways. Use is usually made of ultrasonic (References 2, 3), sandblasting (Reference 2) or water-jet-based drilling methods. The holes produced by drilling have diameters of hundreds of µm and are therefore only suitable to a limited extent for fabricating small MEMS or MOEMS components. Such drilling methods, furthermore, only partially meet clean room criteria. To avoid such disadvantages, it is known to fabricate the contact holes by laser beam drilling. Although such drilling avoids the abovementioned disadvantages, it often leads to material stresses or melting due to high temperatures. This poses problems during further processing of the component. For this reason, the forming of contact holes has been changed to chemical or plasma-chemical patterning.

SUMMARY AND OBJECTS OF THE INVENTION

It is therefore an object of the invention to provide a method for fabricating a component, in particular a microelectromechanical or microoptoelectromechanical component, that is simple to accomplish in terms of manufacturing technology.

It is a further object of the invention to achieve the above object by means of a method that achieves a reliable hermetically tight encapsulation of corresponding active structures of a component.

It is yet a further object of the invention to achieve the above objects by a method that achieves the electrical contacts for making contact with the active structures to be led out from the component to be hermetically sealed.

The present invention addresses the preceding objects by providing, in a first aspect, a method for fabricating a component, in particular a micromechanical, microelectromechanical or microoptoelectromechanical component. Such method is begun by producing a first layer composite having a first substrate and a first insulation layer that covers at least one part of the surface of the first substrate.

A second layer composite is produced having a second substrate and a second insulation layer that covers at least one part of the surface of the second substrate. An (at least partly) conductive structure layer is applied to the first insulation layer.

The second composite is applied to the structure layer in such a way that the second insulation layer adjoins the structure layer. In this way, the first and second layer composites and the structure layer are configured so that at least one part of the structure layer that comprises the active area of the component is hermetically tightly sealed by the first and second layer composites. Contact holes are then formed for making contact with conductive regions of the structure layer within the first and/or second substrate.

In a second aspect, the invention provides a method for fabricating a component, in particular a micromechanical, microelectromechanical or microoptoelectromechanical component. Such method is begun by applying an (at least partly) conductive structure layer to a first nonconductive substrate. A second nonconductive substrate is applied to the structure layer. In this way, the first and second substrates, and also the structure layer, are configured so that at least one part of the structure layer that comprises the active area of the component is hermetically tightly sealed by the first and second substrates. Contact holes are formed for making contact with conductive regions of the structure layer within the first and/or second substrate.

In a third aspect, the invention provides a micromechanical, microelectromechanical and microoptoelectromechanical component. The component includes a first layer composite having a first substrate and a first insulation layer that covers at least one part of the surface of the first substrate.

A second layer composite has a second substrate and a second insulation layer that covers at least one part of the surface of the second substrate. An (at least partly) conductive structure layer is arranged between the first insulation layer and the second insulation layer. The first and second layer composites and, also, the structure layer are configured so that at least one part of the structure layer that comprises the active area of the component is hermetically tightly sealed by the first and second layer composites. Contact holes are provided within the first and/or second substrate for making contact with conductive regions of the structure layer.

In a fourth aspect, the invention provides a micromechanical, microelectromechanical and microoptoelectromechanical component. Such component includes first and second nonconductive substrates. An (at least partly) conductive structure layer is arranged between the first and second substrates so that the first and second substrates and, also, the structure layer are configured so that at least one part of the structure layer that comprises the active area of the component is hermetically tightly sealed by the first and second substrates. Contact holes are provided for making contact with conductive regions of the structure layer within the first and/or second substrates.

The preceding and other features of the invention will become further apparent from the detailed description that follows. Such description is accompanied by a set of drawing figures. Numerals of the drawing figures, corresponding to those of the written description, point to the features of the invention. Like numerals refer to like features of the invention throughout both the drawings and the written text.

DETAILED DESCRIPTION OF THE PREFERRED EMBODIMENT

FIGS. 1 through 10 illustrate the sequential steps for fabrication of a component in accordance with an embodiment of the invention.

Figure 11:
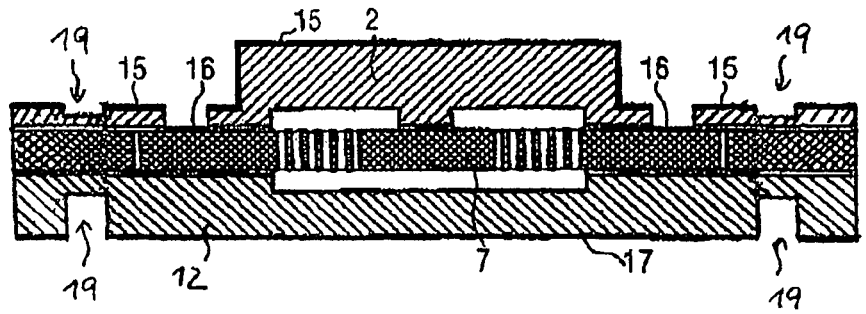
Figure 12:
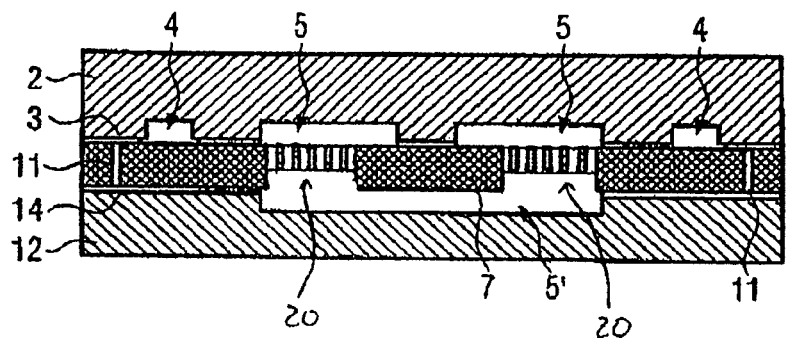
Figure 13:
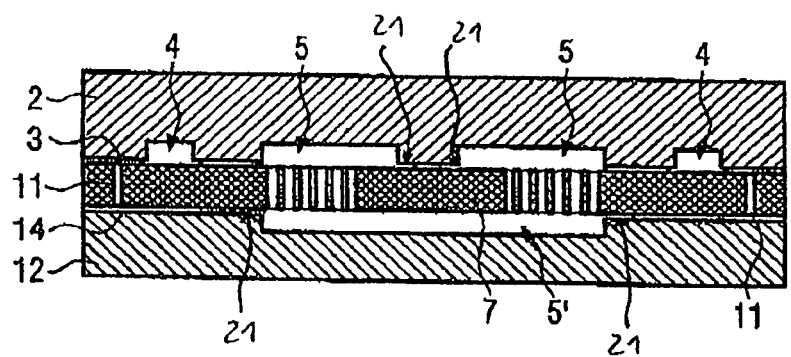

FIGS. 11 through 13 illustrate further embodiments of the fabrication method according to the invention.

Figure 1:
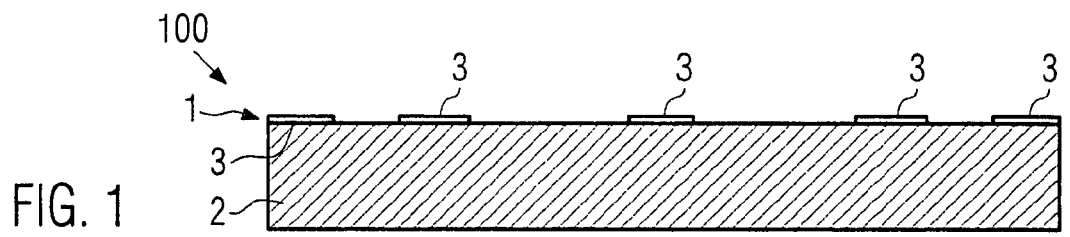
FIGS. 1 through 10 comprise a series of drawings for accompanying the description of a method for fabricating a micromechanical component in accordance with an embodiment of the invention.
Figure 2:
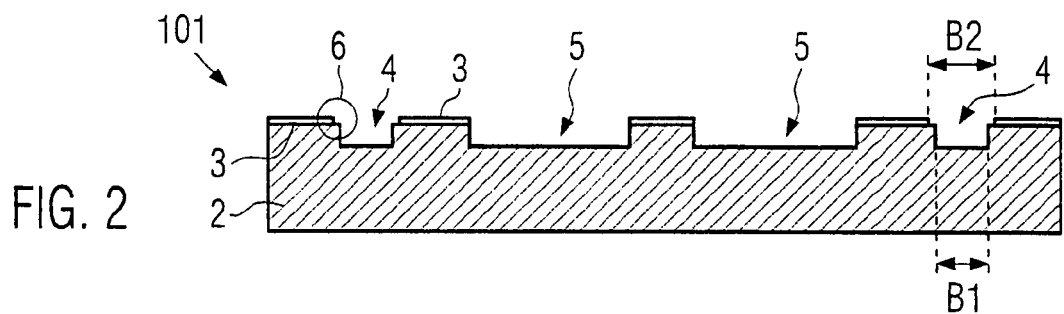

In a first process step 100 as shown in FIG. 1, a patterned first insulation layer 3 is produced on the surface 1 of a first substrate 2. In a second process step 101 as shown in FIG. 2, first depressions 4 and second depressions 5 are produced in the surface 1 of the first substrate 2. As shown, the widths B1 of the first depressions 4 are smaller than the widths B2 of the cutouts of the first insulation layer 3 above the first depressions 4. As a consequence, break edges 6 occur in the regions adjoining the first depressions 4. By contrast, the widths of the second depressions 5 correspond to those of the cutouts of the first insulation layer 3 that lie above the depressions 5.

Figure 3:
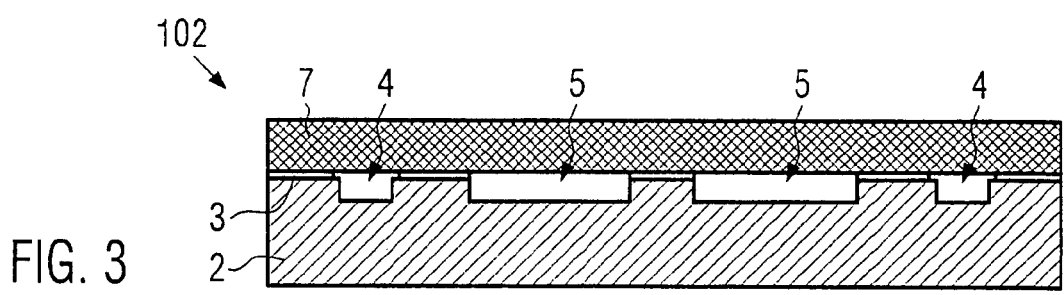

The first composite comprising the first substrate 2 and the first insulation layer 3 obtained this way has a structure layer 7 applied to it in a third process step 102 as illustrated in FIG. 3. The structure layer 7 overlies the individual regions of the first insulation layer 3.

Figure 4:
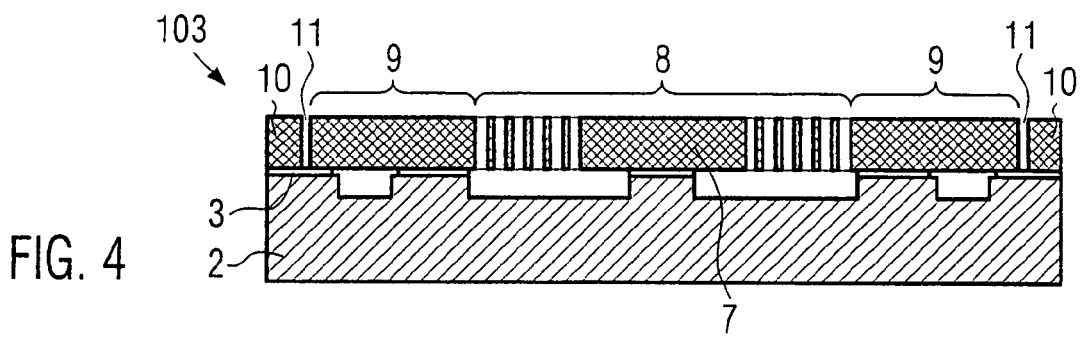

In a fourth process step 103, illustrated in FIG. 4, the structure layer 7 is patterned so that an active structure 8 arises that is electrically connected to conductive regions 9 of the structure layer 7 which laterally adjoin it. Outer regions 10 (the chip edge, i.e. the edge region of the component to be fabricated) of the structure layer 7 are electrically insulated by trenches 11 from the conductive regions 9 "within" the component.

Figure 5:
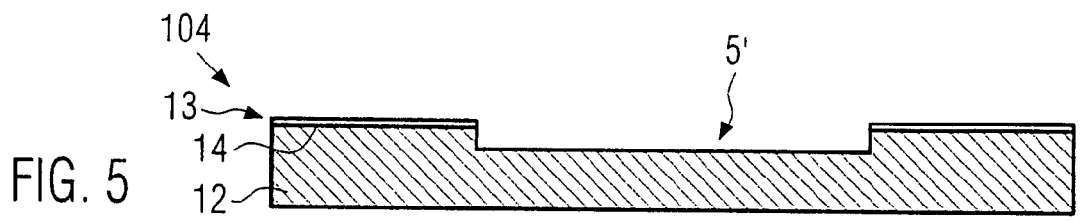

In a fifth process step 104, shown in FIG. 5, a second composite is produced from a second substrate 12 and a second insulation layer 14 applied on a surface 13 of the second substrate 12. A second depression 5' is provided in the surface 13 whose width corresponds to that of the active structure 8.

Figure 6:
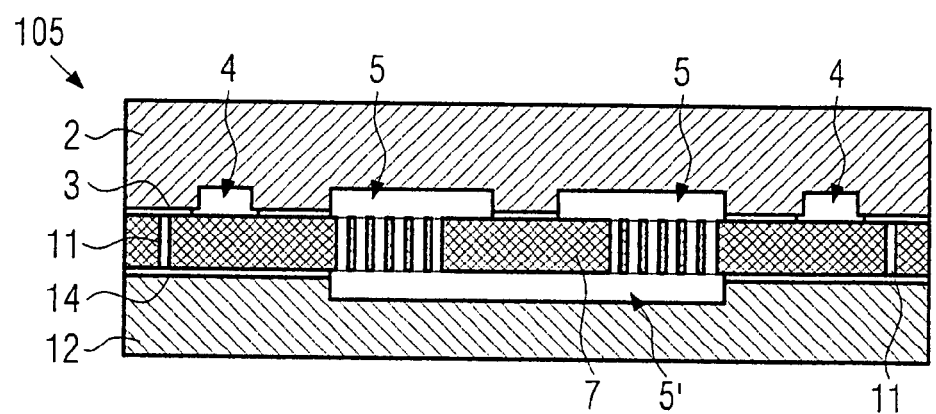

In a sixth process step 105 as shown in FIG. 6, the first composite and the second composite are joined to one another in such a way that the second insulation layer 14 adjoins the structure layer 7 and the second depressions 5, 5' are located respectively above and below the active structure 8.

Figure 7:
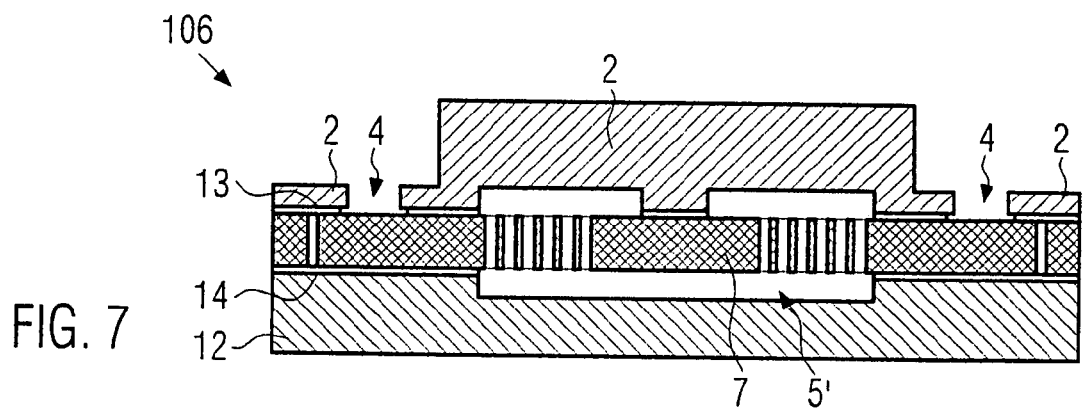

In a seventh process step 106 as shown in FIG. 7, the outer part of the first substrate 2 is etched back down to a vertical position corresponding to the vertical position of the bottoms of the first depressions 4, such that the first depressions 4 are uncovered.

Figure 8:
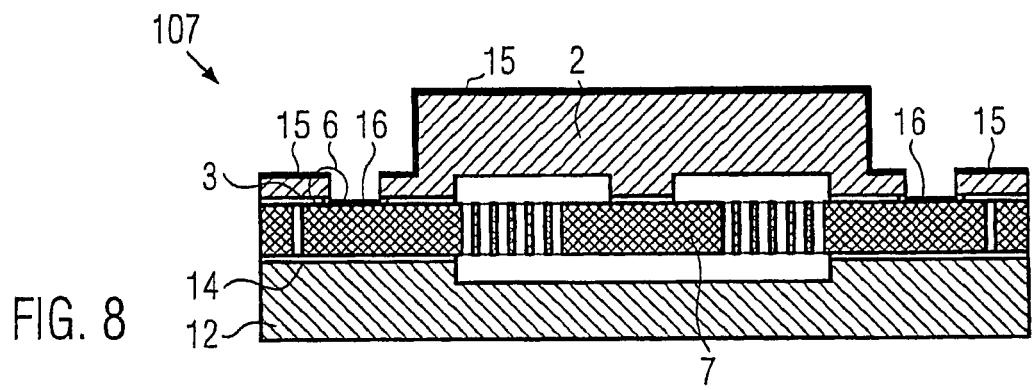

In an eighth process step 107, shown in FIG. 8, a metallization layer 15 is deposited on the surface of the first substrate 2. Due to the presence of the break edges 6, the part of the metallization layer 15 deposited within the first depressions 4 is electrically isolated from the rest of the metallization layer so that metal contact-making areas 16 are created within the first depressions 4.

Figure 9:
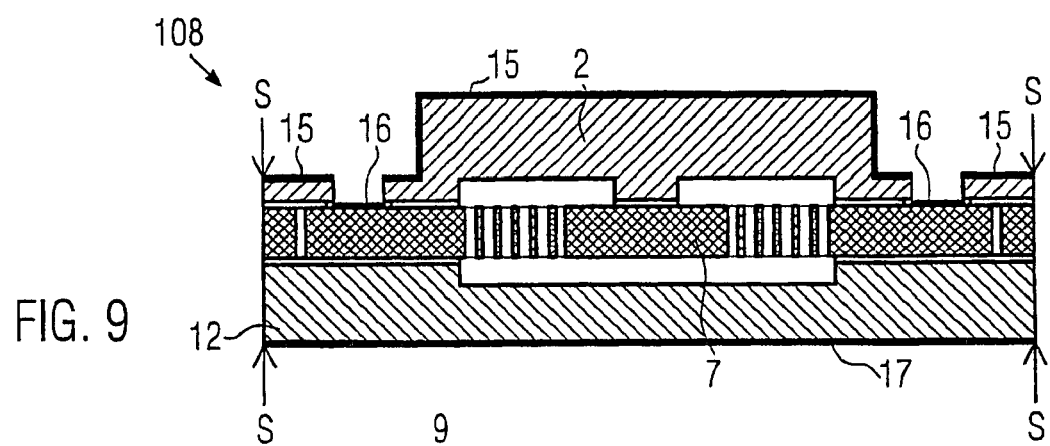

In a ninth process step 108 as illustrated in FIG. 9, a metallization layer 17 is deposited onto the surface of the second substrate 12 remote from the structure layer 7. The metallization layers 15 and 17 serve as shielding electrodes for shielding undesirable electromagnetic fields. The metallization layers 15 and 17 can be connected to a defined, common potential or to different potentials.

A singulation process then occurs, in which the resultant layer composite comprising the first and second substrates 2, 12, the structure layer 7 and the insulation layers 3, 14 is singulated into the individual components at sawing edges S (only a portion from the composite including one component can be seen in the figures).

Figure 10:
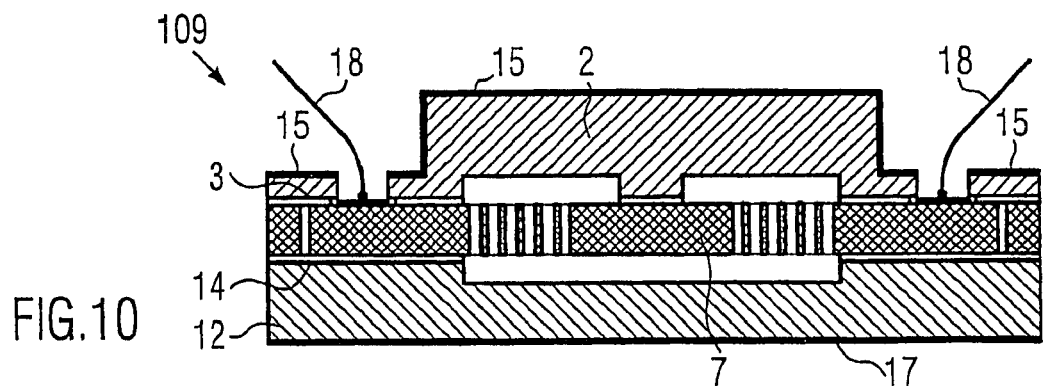

In a tenth process step 109 as shown in FIG. 10, the contact areas 16 are contact-connected by means of bonding wires 18.

Individual components may be singulated by sawing the resultant layer composite as described with respect to FIG. 9. In another embodiment, individual components may be singulated by breaking the resultant layer composite. For this purpose, third depressions 19, as illustrated in FIG. 11, may be produced in surfaces of the first substrate 2 and/or the second substrate 12, wherein the surfaces are remote from the structure layer 7. The third depressions 19 may serve as desired breaking points.

FIG. 12 illustrates structure layer depressions 20 formed in the structure layer 7, wherein the lateral positions of the structure layer depressions 20 at least partly correspond to the lateral positions of the active area of the active structure 8.

FIG. 13 illustrates insulation layer depressions 21 formed in the first insulation layer 3 and/or the second insulation layer 14, wherein the lateral positions of the insulation layer depressions 21 at least partly correspond to the lateral positions of the active area or the active structure 8 of the structure layer 7.

If the first and second substrates 2, 12 are composed of nonconductive materials, then the insulation layers 3, 14 can be omitted.

According to the invention, a description has been given of a method for fabricating microelectromechanical or microoptoelectromechanical components, in particular components having hermetically tightly encapsulated active structures and areas for making electrical contact. The fabrication method according to the invention accomplishes a hermetically tight encapsulation of specific regions of the structure layer at the wafer level with an internal pressure that can be set virtually arbitrarily. The method also affords the possibility of producing a shielding for protection against external electromagnetic interference fields that is electrically insulated from the other electrical contacts.

As illustrated, the fabrication method of the invention employs a first substrate, into which pits are introduced by a suitable method. The first substrate is covered by a joinable electrically insulating interlayer that is set back around the pits. A patterned or patternable structure layer is applied to the first substrate by a suitable joining method. The structure layer has pits that reach either as far as the pits of the first substrate or as far as the interlayer. A second substrate is produced, which likewise has a surface that is patterned with pits and is, in turn, joined with the structure layer of the first substrate. The surface remote from the interlayer of the first substrate is patterned so that pits arise that reach as far as those of the opposite side of the first substrate. An electrically conductive layer is applied over the whole area onto that surface of the first substrate which is remote from the interlayer by a suitable method. In such case the set-back edges of the electrically insulatable, joinable interlayer on the first substrate can serve as a break edge so that connections for electrically insulated regions in the structure layer arise together with the pits in the structure layer of the first substrate. The patterning method of the surface remote from the interlayer of the first substrate simultaneously produces pits that can serve as desired breaking points for a singulation process.

Use is advantageously made of break edges that bring about electrical isolation of the electrically conductive sidewalls of the contact hole from the contact hole bottom, which is (often directly) connected to an electrode of the component to insulate the conductive material of the first substrate.

As is clear from the above description, the fabrication method according to the invention has the following advantages:

The contact holes are opened from the rear side of the first substrate, on which the structure layer was applied by means of a joining process. The joining process is noncritical with regard to joining tolerances if the "alignment" of the structure layer is not effected by means of the joining process, but by means of a double-side lithography, the tolerances of which are significantly smaller than those of the joining process. If the structure layer is patterned prior to application on the substrate, then this advantage is omitted.

The metallization of the contact regions is not carried out until the conclusion of all joining processes. Consequently, it is possible to use methods such as, for example, silicon direct bonding (SFB) with temperature loadings of greater than 400° C. provided that there are no doped active areas within the structure layer whose doping profiles could be impaired at relatively high temperatures.

The contact holes are not opened until after the joining process for hermetically tight closure. As a result, the joining area can be enlarged and the joining process can thus be simplified. "Joining areas" are understood to mean areas that are brought into contact with one another during the joining process. The larger the joining areas, the greater the forces that hold the joining partners (substrate, wafer, etc.) together.

The invention can be applied to the process for fabricating any (miniaturized) components, in particular to the process for fabricating a micromechanical, microelectromechanical or microoptoelectromechanical component, such as acceleration sensors, rate of rotation sensors, pressure sensors, optical couplings, and the like.

The present invention provides, in a first aspect, a method for fabricating a component, in particular a micromechanical, microelectromechanical or microoptoelectromechanical component. Such method is begun by producing a first layer composite having a first substrate and a first insulation layer that covers at least one part of the surface of the first substrate.

A second layer composite is produced having a second substrate and a second insulation layer that covers at least one part of the surface of the second substrate.

An at least partly conductive structure layer is applied to the first insulation layer. The second composite is applied to the structure layer in such a way that the second insulation layer adjoins the structure layer. In this way, the first and second layer composites and the structure layer are configured so that at least one part of the structure layer that comprises the active area of the component is hermetically tightly sealed by the first and second layer composites.

Contact holes are then formed for making contact with conductive regions of the structure layer within the first and/or second substrate.

One essential aspect of the invention is that the active area and, thus, the active structure of the component to be fabricated, is insulated from the environment of the component (as far as contaminants and moisture are concerned) before the contact holes are produced. This has the advantage that, when the first and second layer composites and, also, the structure layer are joined together to form an overall layer composite (joining process), high temperatures (>400° C.) can be employed since the risk of inadvertent dissolution (solid solubility) alloying or melting of contact-connections (metallizations) already formed can be eliminated.

Electric currents, which the active structure requires for the operation of the component, or signals generated by the active structure, are fed to the active structure, or tapped off from the latter, via the contact holes and the adjoining conductive structure layer.

In one preferred embodiment, the active structure of the component fabricated according to the invention is produced by patterning the structure layer. The patterning can be effected before or after the structure layer is applied to the first layer composite. Patterning can be effected for example, by applying a mask on the surface of the structure layer and subsequently etching it. If the structure layer is not patterned until after application to the first layer composite, then no joining tolerances have to be taken into account in the course of applying the structure layer to the first layer composite.

It shall be assumed by way of example that the contact holes are formed within the first substrate. First depressions are preferably produced in the side of the first substrate that faces the structure layer before the structure layer is applied to the first layer composite. The lateral positions of the first depressions at least partly correspond to those of the contact holes formed later in the first substrate. The first depressions can be used as contact holes (or at least as parts of the contact holes) in a later process stage of the fabrication method.

Advantageously, regions of the surface of the first substrate that directly adjoin the first depressions are not covered by the first insulation layer. In other words, the first insulation layer does not reach directly to the "edge" of the first depressions. This way, it is possible to produce break edges that can be utilized in a later process stage for separately making contact with conductive regions of the structure layer and surface regions of the first substrate.

Second depressions are produced in the side of the first and/or second substrate that faces the structure layer before the structure layer is applied to the first layer composite. The lateral positions of the second depressions at least partly correspond to the lateral positions of the active structure of the structure layer. The second depressions can be created in a dedicated process step or together with the first depressions in a common process step. The second depressions enable a mechanical movement (e.g. vibration) of that region of the structure layer that lies within the active area. The second depressions can be employed to set specific parameters of the component. Since mechanical vibration quality under specific conditions depends primarily on the pressure included in the component, the geometry of the active (movable) structure and the direct surroundings, it is possible, for example, to influence the vibration quality of a vibratory active structure by choice of the dimensions of the second depressions. Thus, the vibration quality is greater the deeper the second depressions (given the same pressure within the component).

Structure layer depressions can be formed in the structure layer, the lateral positions of the structure layer depressions at least partly corresponding to the lateral positions of the active area or the active structure of the structure layer. In this case, the second depressions in the first and second substrates can also be omitted in principle as movement of the active structure for a corresponding configuration can be effected solely in the structure layer depressions.

Insulation layer depressions can be formed in the first and/or second insulation layers. The lateral positions of the insulation layer depressions at least partly correspond to the lateral positions of the active area or the active structure of the structure layer. In this case, the second depressions in the first and second substrates and, also, the structure layer depressions can be omitted, in principle, since movement of the active structure for a corresponding configuration can be effected solely in the insulation layer depressions. The insulation layer depressions can serve as a stop for a part of the active structure during movement. That is, the positions/configurations of the insulation layer depressions can be chosen so that a (relatively small) part of the active (movable) structure, when exceeding a specific deflection, strikes the bottom of the insulation layer depressions. This prevents that (relatively large) part of the active structure that can experience a significantly greater deflection as it can move within the second depressions, from striking the bottom of the second depressions with a comparatively high kinetic energy ("breaking protection" of the active structure without restriction of the mechanical quality of the active structure). The portion of the area of the active structure that serves as a stop in such case should be small relative to the remaining proportion of the area of the active structure.

In the fabrication method according to the invention it is possible, of course, to have simultaneous recourse to all types of depressions. That is, the component produced by the fabrication method according to the invention can have all types of depressions simultaneously.

Normally, the first and second substrates in each case constitute part of a wafer or wafer assemblage that will be singulated later. In order to facilitate singulation, third depressions can be produced in the surface of the first substrate and/or second substrate that is remote from the structure layer. The third depressions serve as desired breaking points.

It may be advantageous to produce trenches in the structure layer during patterning. Such trenches electrically insulate the active structures from the outer regions (chip edge) of the structure layer of the component to be fabricated. This insures that the electrical function of the component is not disturbed in an undesired manner, even if the outer ends of the structure layer are not electrically insulated from their surroundings.

If first depressions are formed within the first substrate, then, to form the contact holes, (proceeding from the surface of the first substrate remote from the structure layer) at least one part of the first substrate can be removed to the vertical position of the bottoms of the first depressions. As a result, the first depressions are "opened" from the bottoms of the first depressions and are available as contact holes.

After the formation of the contact holes, a metal layer or some other layer of conductive material is generally deposited on the surface of the first substrate remote from the structure layer. If break edges have previously been created within the first substrate, it is possible to produce both a shielding electrode on the surface of the first substrate (for shielding the component from undesired radiation) and a contact layer (on the bottoms of the contact holes) that is electrically insulated from the shielding surface and serves to make contact with the conductive regions of the structure layer in a single step by a single deposition process. The use of break edges thus makes it possible to make contact simultaneously with regions that are to be electrically insulated from one another in a single process step.

The contact holes, the first to third depressions and/or the structure layer are preferably formed by an etching method although the invention is not so limited.

In a particularly preferred embodiment, both the first and second substrates and the structure layer are silicon. The invention is not limited to such materials, rather other materials/material combinations are also possible. Silicon generally possesses good mechanical properties, high availability and well-developed processing methods. When all the components are of silicon, the following advantages are obtained: low thermal stress and also low outgassing (compared with PYREX or SD2, (such a glass that is commercially available from Hoya and Corning Glass). As such, it is possible to realize pressures of less than 0.01 mbar within the component.

In a second aspect, the invention provides a method for fabricating a component, in particular a micromechanical, microelectromechanical or microoptoelectromechanical component. Such method is begun by applying an (at least partly) conductive structure layer to a first non conductive substrate. A second nonconductive substrate is applied to the structure layer. In this way, the first and second substrates and, also, the structure layer are configured so that at least one part of the structure layer that comprises the active area of the component is hermetically tightly sealed by the first and second substrates. Contact holes are formed for making contact with conductive regions of the structure layer within the first and/or second substrate.

In this method, the function of the insulation layers used in the first aspect of the invention is replaced by the nonconductivity of the first and second substrates. The first and second substrates are preferably composed of quartz, PYREX or SD2. All the embodiments described in connection with the previous method apply analogously as applicable.

In one preferred embodiment, the contact holes are formed in the first substrate, and first depressions are produced in that side of the first substrate that faces the structure layer before the structure layer is applied to the first substrate. The lateral positions of the first depressions at least partly correspond to the lateral positions of the contact holes which are formed later in the first substrate. The first depressions have a stepped form so that the lateral dimensions of the upper regions of the first depressions are larger than those of corresponding lower regions. The stepped form serves as a break edge during the later deposition of a conductive layer (shielding electrode). The stepped course of the first depressions can be produced, for example, by a two-stage patterning process. The break edges that were formed by the transitions between the first insulation layer and the edges of the first depressions in the previously described fabrication method are therefore replaced by the stepped courses of the first depressions.

A preferred embodiment of the fabrication method of the invention will be explained in more detail below. A method for fabricating a component having vertical, electrically insulated contact holes via which electrical contact can be made with individual electrodes of the component will be described.

First, a joinable interlayer (e.g. thermal silicon oxide) is applied to a suitable first substrate (e.g. silicon). The interlayer is removed in specific regions by means of a suitable patterning method (for example "RIE" (reactive ion etching)). The interlayer is removed in regions within or below which are later situated self-supporting elements that are employed for reducing damping in one direction (z direction) in for example, acceleration sensors and gyroscopes. The interlayer is removed in regions that lie directly above the conductive regions for making contact with the structure layer. In such regions, the lateral dimensions of the interlayer are larger than pits (first and second depressions) introduced into the first substrate in a later patterning step.

In a subsequent joining process (for example "silicon fusion bonding" (SFB)), that may be followed by thinning to a desired layer thickness, a structure layer is applied to the first substrate (more specifically, to the interlayer applied thereto). The structure layer will contain the active components of the component after further processing steps. By suitable patterning methods (e.g. "deep reactive ion etching" (DRIE)), pits are created in the structure layer that reach down to the interlayer or as far as the pits. In this way it is possible to create regions which are electrically insulated by trenches in the lateral direction, the minimum trench width being determined by technology parameters such as thickness of the structure layer and maximum aspect ratio of the apparatus used for carrying out the DRIE method.

Further, pits (second depressions) are introduced in a second substrate by suitable patterning methods, (e.g. wet-chemical etching or a DRIE method). The composite comprising first substrate, interlayer and structure layer is connected to the second substrate in aligned manner by a joining process. The pits in the second substrate are located in the region of the movable or active structures of the first composite. It is possible in this way to both achieve mechanical protection of specific elements of the structure layer and, if required, set a defined internal pressure. If the second substrate is composed of a conductive or semiconducting material, the surface of the second substrate must first be provided with a joinable second insulation layer (e.g. thermal $SiO_2$,) to prevent short circuits between the individual electrically conductive regions.

The second joining process is followed by suitable patterning of the overall composite, comprising first and second composites. The patterning is effected from the rear side of the first substrate by means, for example, of a DRIE method. The depth of the patterning process extends as far as the pits in the contact hole areas of the first substrate. As a result, contact hole regions become accessible from the rear side of the first substrate for subsequent contact metallization. Hermetic closure of the interior of the component is simultaneously insured.

Finally, the overall composite is metallized by a suitable metallization method (e.g. sputtering or vapor deposition) over the whole area on the rear side of the first substrate. A break of the metallization layer occurs as a result of the set-back edges of the insulating interlayer between the first substrate and the structure layer. This produces electrical insulation between the individual electrodes (contact holes) and the whole-area metallization on the surface of the first substrate.

The surface of the second substrate can also be conductively coated over the whole area after formation of the overall composite. In this case, both substrates are utilized as a shielding electrode. The individual electrically isolated regions can be contact-connected by wire bonding.

In a third aspect, the invention provides a micromechanical, microelectromechanical and microoptoelectromechanical component. The component includes a first layer composite having a first substrate and a first insulation layer that covers at least one part of the surface of the first substrate.

A second layer composite has a second substrate and a second insulation layer that covers at least one part of the surface of the second substrate. An (at least partly) conductive structure layer is arranged between the first insulation layer and the second insulation layer. The first and second layer composites and, also, the structure layer are configured so that at least one part of the structure layer that comprises the active area of the component is hermetically tightly sealed by the first and second layer composites. Contact holes are provided within the first and/or second substrate for making contact with conductive regions of the structure layer.

In a fourth aspect, the invention provides a micromechanical, microelectromechanical and microoptoelectromechanical component. Such component includes a first nonconductive substrate and a second nonconductive substrate. An at least partly conductive structure layer is arranged between the first and second substrates so that the first and second substrates and also the structure layer are configured so that at least one part of the structure layer that comprises the active area of the component is hermetically tightly sealed by the first and second substrates.

While the invention has been described with reference to its presently-preferred embodiment, it is not limited thereto. Rather the invention is limited only insofar as it is defined by the following set of patent claims and includes within its scope all equivalents thereof.

REFERENCES

1. Daniel Lapadatu et al., "Dual-Axes Capacitive Inclinometer/Low-g Accelerometer for Automotive Application", MEMS 2001, pp. 34-37, 2001
2. Th. Diepold, E. Obermeier, "Bulk Micromachining of Borosilicate Glass by Ultrasonic Drilling and Sandblasting", Microsystems Technologies 96, pp. 211-216, 1996
3. U. Breng et al., "CORS—A Bulk Micromachined Gyroscope Based on Coupled Resonators", Transducers '99, pp. 1570-1573, 1999
4. A. Gaiβer et al., "Digital Readout Electronics for Micro-Machined Gyroscopes with Enhanced Sensor Design", Symposium Gyro Technology 2002, pp. 5.0-5.11, 2002
5. T. Gessner et al., "Micromechanical acceleration measuring device and method for fabricating it", EP 000000623824 A1

What is claimed is:

1. A method for fabricating a micromechanical component, comprising the following steps:
   producing a first layer composite having a first substrate and a first insulation layer, which covers at least one part of a first surface of the first substrate, wherein first depressions are produced in the first surface of the first substrate,
   producing a second layer composite having a second substrate and a second insulation layer, which covers at least one part of a surface of the second substrate,
   after forming the first depressions, applying an at least partly conductive structure layer to the first layer composite, wherein the structure layer is formed on the insulation layer and over portions of the first substrate, in which the first depressions are produced, applying the second composite to the structure layer in such a way that the second insulation layer adjoins the structure layer, wherein the first and second layer composites and also the structure layer are configured in such a way that at least one part of the structure layer which comprises an active area comprising an active structure of the component is sealed by the first and second layer composites, after applying the second composite to the structure layer, forming contact holes within the first substrate for making contact with conductive regions of the structure layer, wherein lateral positions of the contact holes at least partly overlap with lateral positions of the first depressions, and wherein the lateral positions of the first depressions at least partly overlap with lateral positions of the conductive regions of the structure layer to be contacted through the contact holes.

2. The method as claimed in claim 1, characterized in that the active structure is produced by patterning the structure layer, wherein the patterning is effected before or after the structure layer is applied to the first layer composite.

3. The method as claimed in claim 1, characterized in that regions of the first surface of the first substrate which directly adjoin the first depressions are not covered by the first insulation layer.

4. The method as claimed in claim 1, characterized in that second depressions are produced in that side of the first and/or second substrate which faces the structure layer before the structure layer is applied to the first layer composite, lateral positions of said second depressions at least partly overlap with lateral positions of the active structure of the structure layer.

5. The method as claimed in claim 1, characterized in that third depressions are produced in a second surface of the first substrate which is opposite to the first surface of the first substrate, said third depressions serving as breaking points.

6. The method as claimed claim 1, characterized in that trenches are produced in the structure layer during the patterning of the structure layer, said trenches electrically insulating the active structure from outer regions of the structure layer.

7. The method as claimed in claim 1, characterized in that, for forming the contact holes, proceeding from a second surface of the first substrate which is opposite to the first surface of the first substrate, at least one part of the first substrate is removed as far as a vertical position of bottoms of the first depressions.

8. The method as claimed in claim 1, characterized in that after the contact holes have been formed, a metal layer is deposited on a second surface of the first substrate which is opposite to the first surface of the first substrate.

9. The method as claimed in claim 1, 4 or 5, characterized in that the contact holes, the depressions and/or the structure layer are formed by means of an etching method.

10. The method as claimed in claim 1, characterized in that the first substrate, the second substrate and also the structure layer are composed of the same semiconductor material.

11. The method as claimed in claim 1, characterized in that structure layer depressions are formed in the structure layer, positions of said structure layer depressions at least partly overlap with the lateral positions of the active structure of the structure layer.

12. The method as claimed in claim 1, characterized in that insulation layer depressions are formed in the first and/or second insulation layer, lateral positions of said insulation layer depressions at least partly overlap with lateral positions of the active structure of the structure layer.

13. The method as claimed in claim 12, characterized in that the insulation layer depressions are configured to stop a movement of a part of the active structure.

14. A method for fabricating a micromechanical component, comprising the following steps:

producing first depressions in a first surface of a first nonconductive substrate, after producing the first depressions, applying an at least partly conductive structure layer to the first surface of the first nonconductive substrate, wherein the structure layer is formed over portions of the first substrate, in which the first depressions are produced, applying a second nonconductive substrate to the structure layer, wherein the first and second substrates and also the structure layer are configured in such a way that at least one part of the structure layer which comprises an active area of the component is sealed by the first and second substrates, after applying the second nonconductive substrate to the structure layer, forming contact holes within the first substrate for making contact with conductive regions of the structure layer, wherein lateral positions of the contact holes at least partly overlap with lateral positions of the first depressions, and wherein the lateral positions of the first depressions at least partially overlap with lateral positions of the conductive regions of the structure layer to be contacted through the contact holes.

15. The method as claimed in claim 14, characterized in that the first and second substrates comprise quartz or glass.

16. The method as claimed in claim 14, characterized in that the first depressions have a stepped form in such a way that lateral dimensions of upper regions of the first depressions are larger than the lateral dimensions of lower regions of the first depressions, wherein the upper regions are arranged near the first surface of the first substrate and wherein the lower regions are arranged further from the first surface of the first substrate than the upper regions.

17. The method as claimed in claim 16, characterized in that the stepped form of the first depressions is produced by means of a two-stage patterning process.

18. The method as claimed in claim 9, wherein the semiconductor material is silicon.

* * * * *